United States Patent [19]
Korsfeldt

[11] Patent Number: 6,166,568
[45] Date of Patent: Dec. 26, 2000

[54] METHOD AND ARRANGEMENT FOR GENERATING ORTHOGONAL SINUSOIDAL SIGNALS

[75] Inventor: Dan Korsfeldt, Älvdalsvägen, Sweden

[73] Assignee: Telefonaktiebolaget LM Ericsson (publ), Stockholm, Sweden

[21] Appl. No.: 09/153,357

[22] Filed: Sep. 15, 1998

[30] Foreign Application Priority Data

Sep. 15, 1997 [SE] Sweden .................................. 9703317

[51] Int. Cl.[7] .................................................. H03B 21/00
[52] U.S. Cl. ........................................ 327/105; 106/158
[58] Field of Search .................................. 327/105, 106, 327/156, 158, 159

[56] References Cited

U.S. PATENT DOCUMENTS

| | | | |
|---|---|---|---|
| 4,761,751 | 8/1988 | Canniff | 708/276 |
| 5,126,960 | 6/1992 | Thong | 708/276 |
| 5,132,554 | 7/1992 | Hiramatsu et al. | 327/154 |
| 5,198,779 | 3/1993 | Bruton | 327/105 |
| 5,400,363 | 3/1995 | Waugh et al. | 375/324 |

OTHER PUBLICATIONS

Norbert J. Fliege et al., "Complex Digital Oscillators and FSK Modulators", IEEE Transactions on Signal Processing, vol. 40, No. 2, Feb. 1992, p. 333–342.

F. E. Churchill et al., "The Correction of I and Q Errors in a Coherent Processor", IEEE Transactions on Aerospace and Electronic Systems, vol. AES–17, No. 1, Jan. 1981, pp. 131–137.

*Primary Examiner*—Kenneth B. Wells
*Attorney, Agent, or Firm*—Burns, Doane, Swecker & Mathis, L.L.P.

[57] ABSTRACT

A method and arrangement for generating orthogonal sinusoidal signals in a digital oscillator. The oscillator includes a signal generator which generates a digital sinusoidal signal. The digital sinusoidal signal is fed into a phase shifter which is separate from the signal generator. The phase shifter derives from the digital sinusoidal signal a first pair of digital sinusoidal signals having a phase difference corresponding to at least one sample step. The first pair of digital sinusoidal signals is fed into an orthogonalization unit which produces a pair of orthogonal digital sinusoidal signals by forming linear combinations of the first pair of digital sinusoidal signals.

24 Claims, 4 Drawing Sheets

METHOD AND ARRANGEMENT FOR GENERATING ORTHOGONAL SINUSOIDAL SIGNALS

TECHNICAL FIELD OF THE INVENTION

The invention relates to a method and arrangement in a digital oscillator generating orthogonal sinusoidal signals. The digital oscillator may be used in e.g. radio receivers in base stations or wireless terminals.

DESCRIPTION OF RELATED ART

In modern radio receivers, for example used in base stations and wireless terminals such as cellular phones or cordless phones, an increasing part of the signal processing is performed digitally. The received signal is sampled at an intermediate frequency which implies that frequency conversion from the intermediate frequency down to a base band signal must be done digitally. In a receiver receiving a quadrature modulated radio signal, i.e. where the received signal contains an I-component (inphase component) and a Q-component (quadrature component), two digital orthogonal sinusoidal signals must be generated for use in the frequency conversion process. These digital sinusoidal signals are generated by a digital oscillator. Each digital sinusoidal signal consists of a sequence of digitally-encoded values representing samples of a continuous-time sinusoidal signal.

Traditionally a complex sinusoidal signal is generated by using a digital lookup table. The table contains precalculated values of sample points of a section of a sinusoidal signal. When generating a digital sinusoidal signal, samples are read from a memory containing the digital lookup table. In order to generate two orthogonal sinusoidal signals, two samples are read out in parallell from the table with an index offset corresponding to a $\pi/2$ radians phase difference. One problem associated with the traditional solution is that when there is a mismatch between the desired frequency of the generated sinusoidal signals and the sample interval in the lookup table, discontinuities occur in the generated sinusoidal signals. Another problem is that the two generated signals may not have completely orthogonal components.

"Complex Digital Oscillators and FSK Modulators" by N. J. Fliege and Jörg Wintermantel published in IEEE Transactions on Signal Processing, vol. 40 no 2. February 1992, discusses different ways of implementing complex digital oscillators generating pairs of digital orthogonal sinusoidal signals. One example of such an oscillator is described in connection with FIG. 4 of the paper. The oscillator comprises a correction network connected to a marginally stable second order filter loop.

Since the correction network is connected to two nodes of the filter loop, both these nodes must be accessible to the correction network. Also, coefficients used in the correction network are completely determined by the desired oscillation frequency, and therefore, it is not possible to modify these coefficients to achieve better numerical properties.

SUMMARY OF THE INVENTION

The problem dealt with by the present invention is to provide a more flexible way of generating a pair of orthogonal digital sinusoidal signals.

The problem is solved essentially by a method in which a digital sinusoidal signal is first generated. From said generated signal a first pair of digital sinusoidal signals having a phase difference is then derived. Said pair of orthogonal digital sinusoidal signals is produced by forming linear combinations of the first pair of signals. The problem solution includes the necessary means for implementing the method.

More specifically, the problem is solved in the following manner. A digital sinusoidal signal having a predetermined oscillation frequency is generated in a signal generator. The digital sinusoidal signal is fed into phase shifting means, wherein the phase shifting means is separate from the signal generator. The phase shifting means derives from the digital sinusoidal signal a first pair of digital sinusoidal signals having a phase difference corresponding to at least one sample period. Said pair of orthogonal digital sinusoidal signals is produced by forming linear combinations of the first pair of signals.

A general intention of the invention is to provide a highly flexible way of generating pairs of orthogonal digital sinusoidal signals.

Another intention is to be able to generate pairs of orthogonal digital sinusoidal signals from an arbitrary digital single sinuosidal source.

Still another intention is to enable better control of numerical properties in the signal generation process.

A general advantage afforded by the invention is that pairs of orthogonal digital sinusoidal signals can be generated in a highly flexible way.

Another advantage is that pairs of orthogonal digital sinusoidal signals can be generated from an arbitrary digital single sinuosidal source.

Still another advantage of the invention is that better control of numerical properties in the signal generation process is achieved.

The invention will now be described in more detail with reference to exemplifying embodiments thereof and also with reference to the accompanying drawings.

DETAILED DESCRIPTION OF THE EMBODIMENTS

Figure 1A:
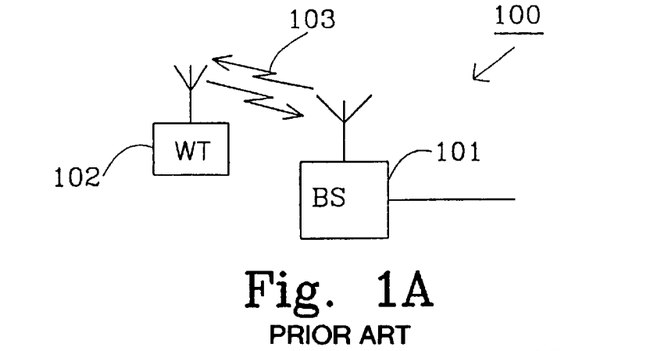
FIG. 1A is a view illustrating part of a radio communication network.

FIG. 1A illustrates a part of a radio communication network 100 in which a base station 101 via radio signals is communicating with a wireless terminal 102, e.g. a cellular phone or cordless phone. Radio signals 103 transmitted between the base station 101 and the wireless terminal 102 are quadrature modulated, i.e. each radio signal contains an I-component (inphase component) and a Q-component (quadrature component).

Figure 1B:
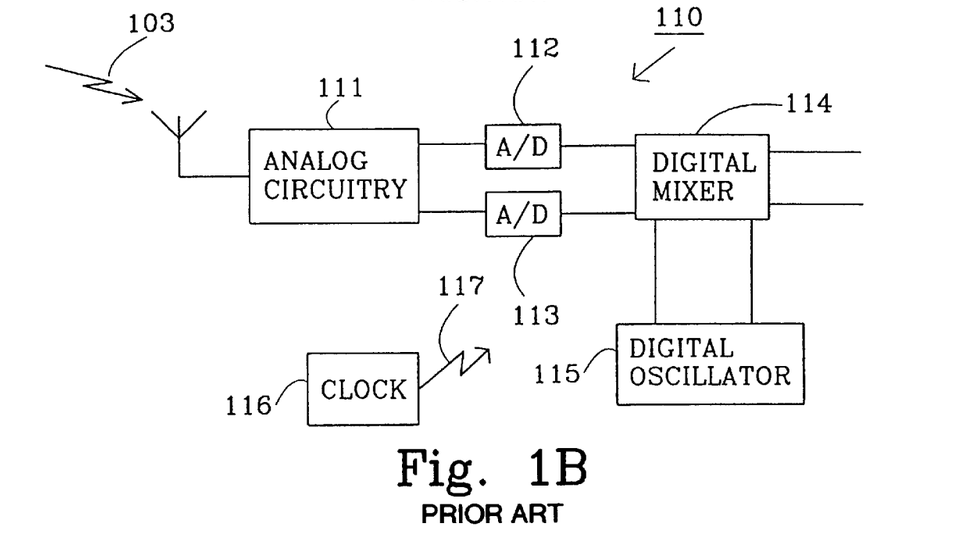
FIG. 1B is a block diagram illustrating parts of a radio receiver.

FIG. 1B illustrates parts of a radio receiver 110 used in either the base station 101 or the wireless terminal 102. The received radio signal 103 is converted by analog circuitry 111 into two signals in an intermediate frequency band, i.e. IF-signals. The IF-signals are sampled at a predetermined sampling frequency and converted into digital format by two A/D-converters 112–113. The digital IF-signals are further converted into baseband frequency by a digital mixer 114. The digital mixer 114 is supplied with a pair of orthogonal digital sinusoidal signals from a digital oscillator 115. The output from the digital mixer 114 comprises two digital signals, one representing the I-component and the other digital signal representing the Q-component.

A clock 116 generates a clock signal 117 which controls and synchronizes the operation of the A/D-converters 112–113, the digital mixer 114 and the digital oscillator 115.

Figure 2A:
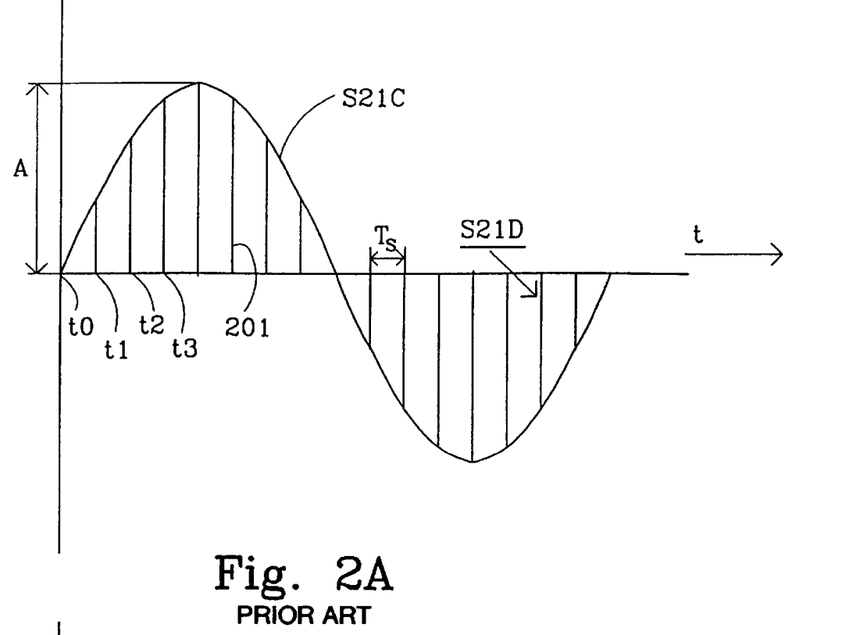
FIG. 2A is a time diagram illustrating the relationship between an analog sinusoidal signal and a corresponding digital sinusoidal signal.

FIG. 2A illustrates the relationship in general between an analog sinusoidal signal, or continuous time sinusoidal signal, and a digital sinusoidal signal. The analog signal S21C is defined mathematically as:

$$y_{21}(t)=A \sin(2\pi f_0 t) \quad (1)$$

where A is the amplitude, $f_0$ is the oscillation frequency of the analog signal S21C and t is time. The analog signal S21C is illustrated as a continuous sinusoidal line in FIG. 2A.

The digital sinusoidal signal S21D corresponding to the analog signal S21C consists of a sequence of digitally-encoded values representing samples 201 of the analog sinusoidal signal S21C. The samples are taken at times t0, t1, t2, t3 etc that are spaced from one another by a sample period $T_s$ equal to the inverse of a sampling frequency $f_s$. One sample period in the analog domain corresponds to one sample step in the digital domain. The digital signal S21D is illustrated in FIG. 2A as vertical lines representing samples 201 of the analog signal S21C. The digital sinusoidal signal S21D corresponding to the analog sinusoidal signal S21C can be expressed as:

$$y_{21}(k)=A \sin(2\pi(f_0/f_s)k) \quad (2)$$

where k=0, 1, 2 . . . is an index variable. The index variable k in the digital domain corresponds to time t in the analog domain.

A more convenient way of expressing (2) is by introducing a normalized oscillation frequency $\Omega_0$ defined as $$\Omega_0=2\pi f_0/f_s \quad (3)$$

Thus (2) can be expressed for the digital sinusoidal signal as:

$$y_{21}(k)=A \sin(\Omega_0 k) \quad (4)$$

Figure 2B:
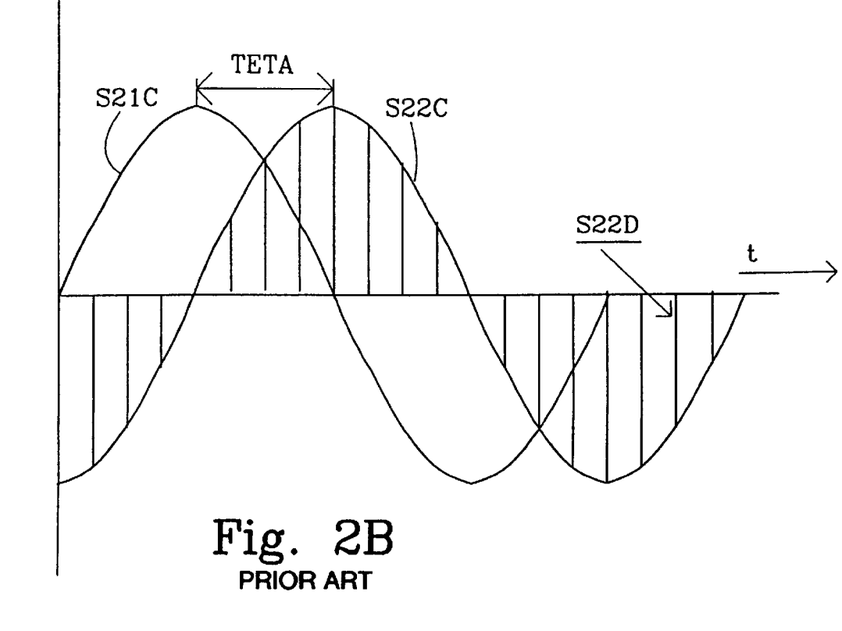
FIG. 2B is a time diagram illustrating the relationship between a pair of orthogonal sinusoidal signals

FIG. 2B illustrates a pair of orthogonal analog signals, the analog sinusoidal signal S21C from FIG. 2A together with a second analog sinusoidal signal S22C. A digital sinusoidal signal S22D corresponding to the second analog sinusoidal signal S22C is also illustrated. The second sinusoidal signal S22C can be expressed mathematically as:

$$y_{22}(t)=A \sin(2\pi f_0 t + \pi/2)=A \cos(2\pi f_0 t) \quad (5)$$

The digital sinusoidal signal S22D corresponding to the second analog sinusoidal signal S22C can be expressed mathematically as:

$$y_{22}(k)=A \cos(\Omega_0 k) \quad (6)$$

The two analog sinusoidal signals in FIG. 2B, defined by expressions (1) and (5), form an orthogonal pair of analog sinusoidal signals, i.e. the signals have a phase difference TETA of $\pi/2$ radians. The corresponding digital sinusoidal signals S21D and S22D, defined by expressions (4) and (6), also constitute a pair of orthogonal digital sinusoidal signals.

As described above, the digital oscillator 115 in FIG. 1B generates a pair of orthogonal digital sinusoidal signals. The two orthogonal digital sinusoidal signals generated by the oscillator 115 could e.g. be identical to the digital sinusoidal signals S21D and S22D illustrated in FIG. 2A and FIG. 2B. However, as is obvious to the skilled person, the digital oscillator 115 generates the two digital sinusoidal signals not by sampling two analog sinusoidal signals, but by calculating two corresponding sequences of digital values. Even though the digital oscillators discussed in this document do not sample analog sinusoidal signals but instead calculate the corresponding sequences of digital values, we still regard each digital sinusoidal signal as if it would have been generated by sampling a corresponding analog sinusoidal signal with a certain sample frequency/sample period.

Figures 3, 4:
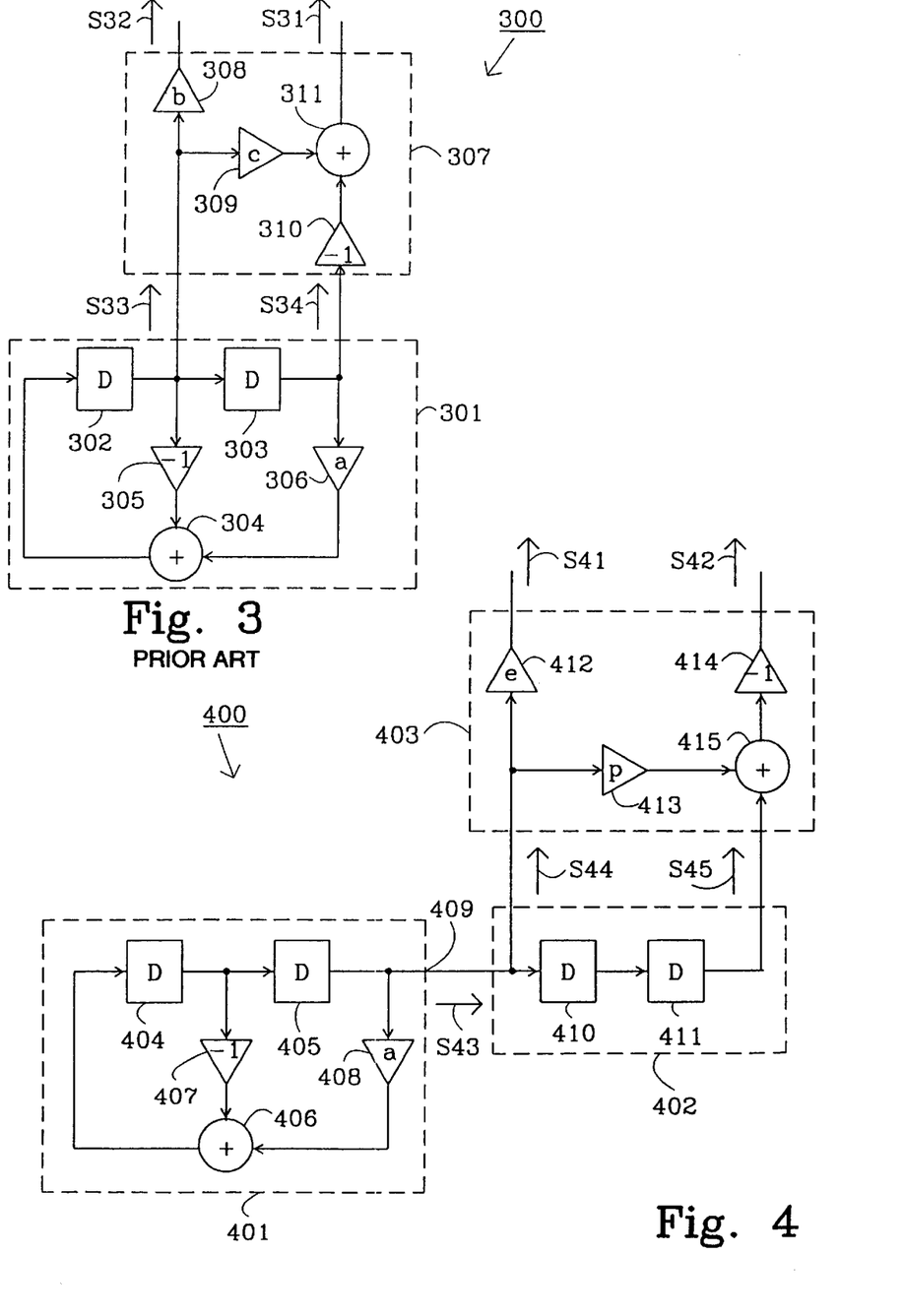
FIG. 3 is a block diagram illustrating a prior art digital oscillator.
FIG. 4 is a block diagram illustrating one embodiment of the present invention.

FIG. 3 illustrates a prior art digital oscillator 300 generating two orthogonal digital sinusoidal signals S31 and S32 respectively.

The oscillator 300 comprises a marginally stable second order filter loop 301. The filter loop 301 comprises a first delay block 302 and a second delay block 303, an adder 304, a first multiplier 305 and a second multiplier 306. The delay blocks 302–303 and the multipliers 305–306 have one input and one output each while the adder 304 has two inputs and one output. The output of the first delay block 302 is connected both to the input of the second delay block 303 and to the input of the first multiplier 305. The output of the first multiplier is connected to one input of the adder 304. The output of the second delay block 303 is connected to the input of the second multiplier 306 whose output is connected to a second input of the adder 304. The output of the adder 304 is connected to the input of the first delay block 302.

The delay of each delay block is one sample step. The first multiplier 305 multiplies its input with a factor of $-1$, while the second multiplier 306 multiplies its input with a factor $a=2\cos\Omega_0$.

A digital signal S33 is generated from the output of the first delay block 302 while a digital signal S34 is generated from the output of the second delay block 303. The digital signals S33 and S34 can mathematically be described by state variables $x_{33}(k)$ and $x_{34}(k)$ respectively.

Selecting the intial values of the state variables as $$x_{33}(0)=\sin(\Omega_0) \text{ and } x_{34}(0)=0$$

results in the following expression for $x_{34}(k)$:

$$x_{34}(k)=\sin(\Omega_0 k) \quad (7)$$

Selecting the intial values of the state variables as $$x_{33}(0)=\cos(\Omega_0) \text{ and } x_{34}(0)=1$$

results in the following expression for $x_{34}(k)$ $$x_{34}(k)=\cos(\Omega_0 k) \quad (8)$$

The state variable $x_{34}$ (k) (and the corresponding digital sinusoidal signal S34 as well), can be assigned an arbitrary initial phase by choosing a proper linear combination of the initial values of the state variables.

The digital oscillator 300 further comprises a correction network 307 connected to the second order marginally stable filter loop 301. The correction network 307 comprises three multipliers 308–310 and an adder 311. The multipliers 308–310 have one input and one output each while the adder has two inputs and one output. The inputs of the first multiplier 308 and the second multiplier 309 are connected between the two delay blocks 302–303 in the filter loop 301, the input of the third multiplier 310 is connected to the output of the second delay block 303 in the filter loop 301. The outputs from the second multiplier 309 and the third multiplier 310 are connected to the inputs of the adder 311, respectively. The first multiplier 308 multiplies its input with a factor $b=\sin\Omega_0$, the second multiplier 309 multiplies its input with a factor $c=\cos\Omega_0$ and the third multiplier multiplies its input with a factor −1.

The two orthogonal digital sinusoidal signals S31, S32 generated by the digital oscillator 300 are available on the outputs of the adder 311 and first multiplier 308, respectively. If the state variables $x_{33}(k)$ and $x_{34}(k)$, corresponding to the digital signals S33 and S34 respectively are given the initial values $x_{33}(0)=0$ and $x_{34}(0)=-1$, the signals S31 and S32 can be described by state variables $y_{31}(k)$ and $y_{32}(k)$ respectively, as:

$$y_{31}(k)=\cos(\Omega_0 k) \quad (9)$$

$$y_{32}(k)=\sin(\Omega_0 k) \quad (10)$$

Further details of the digital oscillator 300 and the marginally stable second order filter loop 301 can be found in "Complex Digital Oscillators and FSK Modulators" by N. J. Fliege and Jörg Wintermantel published in IEEE transactions on signal processing, vol. 40 no 2. February 1992.

In the prior art digital oscillator 300 both the factor b used by the first multiplier 308 and the factor c used by the second multiplier 309 in the correction network 307 are completely determined by the desired oscillation frequency of the generated orthogonal signals. The digital oscillator 300 uses a limited number of bits to represent each digitally encoded value, which means that factors b and c typically can not be represented exactly but need to be truncated in order to fit within this limited number of bits. The resulting truncation error of factors b and c impairs the degree of orthogonality between the two output signals S31 and S32 from the digital oscillator 300 which results in a so-called image spuriosis. When the digital sinusoidal signals S31 and S32 generated by the digital oscillator 300 are used in the frequency conversion process described in connection with FIG. 1B, the image spuriosis causes undesired signals to be frequency converted into the baseband range which causes distortion of the desired signals.

The invention aims at increasing the flexibility in the way pairs of orthogonal digital sinusoidal signals are generated. In particular, the invention enables the orthogonal digital sinusoidal signal pair to be generated from an arbitrary digital single sinusoidal source. The invention also enables better control of the numerical properties of the signal generation process regarding suppression of image spuriosis.

FIG. 4 illustrates a digital oscillator 400 according to one embodiment of the present invention. The oscillator generates a pair of orthogonal digital signals comprising a first digital sinusoidal signal S41 and a second digital sinusoidal signal S42, both signals having in common a predetermined oscillation frequency, a predetermined sampling frequency and a predetermined amplitude and having a phase difference of π/2 radians between them.

The oscillator 400 can be considered as comprising signal generating means 401, phase shifting means 402 and orthogonalization means 403.

The signal generating means 401 generates a third digital sinusoidal signal S43 having the predetermined oscillation frequency and the predetermined sampling frequency.

The phase shifting means 402 is separated from and connected to the signal generating means 401. The phase shifting means 402 receives the third digital sinusoidal signal S43 from the signal generating means 401 and provides a fourth digital sinusoidal signal S44 and a fifth digital sinusoidal signal S45, both having in common the predetermined oscillation frequency and the predetermined sampling frequency and having a phase difference between them corresponding to a delay of the fifth digital sinusoidal signal S45 with respect to the fourth digital sinusoidal signal S44 of at least one sample step.

The orthogonalization means 403 is connected to the phase shifting means 402 and produces the first digital sinusoidal signal S41 and the second digital sinusoidal signal S42 by forming linear combinations of the fourth digital signal S44 and the fifth digital sinusoidal signal S45 received from the phase shifting means 402.

More in detail, the signal generating means 401 is implemented as a second order marginally stable filter loop identical with the filter loop 301 in FIG. 3. Thus elements 404–408 in FIG. 4 correspond directly to the elements 302–306 in FIG. 3 discussed previously in this disclosure. The generated third digital sinusoidal signal S43 is available from an output 409 of the marginally stable filter.

The phase shifting means 402 comprises delay means in the form of a first delay block 410 connected in series with a second delay block 411, each delay block having an input and an output and providing a delay of one sample step in this example. The input of the first delay block 410 is connected to the output 409 from the signal generating means 401. The first delay block 410 thus receives the third digital sinusoidal signal S43 from the signal generating means 401 and the delay blocks 410–411 derive the fifth digital sinusoidal signal S45 by delaying the third digital sinusoidal signal S43 a total of two sample steps.

The orthogonalization means 403 constitutes a correction network comprising three multipliers 412–414 and an adder 415. The multipliers 412–414 have one input and one output each while the adder has two inputs and one output. The inputs of the first multiplier 412 and the second multiplier 413 are connected to the input of the first delay block 410 of the phase shifting means 402. Thus the phase shifting means 402 provides the third digital sinusoidal signal S43 as the fourth digital sinusoidal signal S44 to the orthogonalization means 403. The output of the second multiplier 413 is connected to one input of the adder 415. A second input of the adder 415 is connected to the output of the second delay block 411 of the phase shifting means 402. The output of the adder 415 is connected to the input of the third multiplier 414.

The first multiplier 412 multiplies its input with a factor of $e=\sin(\Omega_0 N)$. The second multiplier 413 multiplies its input with a factor $p=-\cos(\Omega_0 N)$. The third multiplier 414 multiplies its input with a factor of −1. The expressions for both factors e and p involves a factor N, which is defined as the number of sample steps by which the fifth digital sinusoidal signal S45 is delayed with respect to the fourth digital sinusoidal signal S44. In this particular case N=2 and thus $e=\sin(2\Omega_0)$ and $p=-\cos(2\Omega_0)$.

The first digital sinusoidal signal S41 and the second digital sinusoidal signal S42, i.e. the pair of orthogonal sinusoidal signals generated by the oscillator 400, are available from the orthogonalization means 403, more specifically from the outputs of the first multiplier 412 and the third multiplier 414 respectively.

Mathematically, the oscillator 400 is described by expressions (1)–(15) below, where $x_{41}$–$x_{45}$ correspond to the respective digital sinusoidal signals S41–S45.

The signal generating means 400 is arranged to generate the third digital sinusoidal signal S43 such that $$x_{43}(k) = \cos(\Omega_0 k) \tag{11}$$

The fourth digital sinusoidal signal S44 is identical with the third digital sinusoidal signal S43 and thus $$x_{44}(k) = x_{43}(k) = \cos(\Omega_0 k) \tag{12}$$

The fifth digital sinusoidal signal S45 is delayed N=2 sample steps with respect to the fourth digital sinusoidal signal S44 which can be expressed as:

$$x_{45}(k) = x_{44}(k-N) = \cos(\Omega_0 (k-N)) \tag{13}$$

The orthogonalization means 403 generates the first digital sinusoidal signal S41 and the second digital sinusoidal signal S42 such that $$x_{41}(k) = \sin(N\Omega_0) \cdot \cos(\Omega_0 k) \tag{14}$$

$$x_{42}(k) = \sin(N\Omega_0) \cdot \sin(\Omega_0 k) \tag{15}$$

For each of the different means in FIG. 4 there are several possible embodiments.

Figure 5:
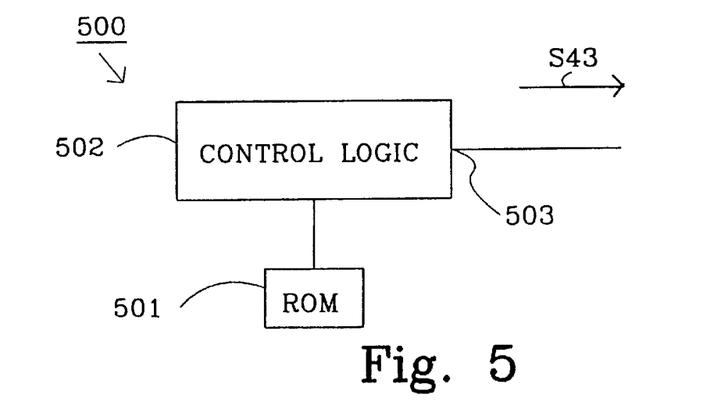
FIG. 5 is a block diagram illustrating alternative signal generating means.

An alternative embodiment of the signal generating means is illustrated in FIG. 5. The signal generating means 500 comprises data storage means 501, e.g. a Read Only Memory (ROM), in which a sequence of values specifying a sinusoidal signal are stored. The signal generating means 500 also comprises control logic 502 connected to the storage means 501 generating the third digital sinusoidal signal S43 by reading values from the storage means and providing the read values to an output 503. The use of the signal generating means 500 in FIG. 5 instead of the signal generating means 401 illustrated in FIG. 4 may be preferred in a digital oscillator operating at a high sampling frequency in order to reduce power consumption.

Figure 6:
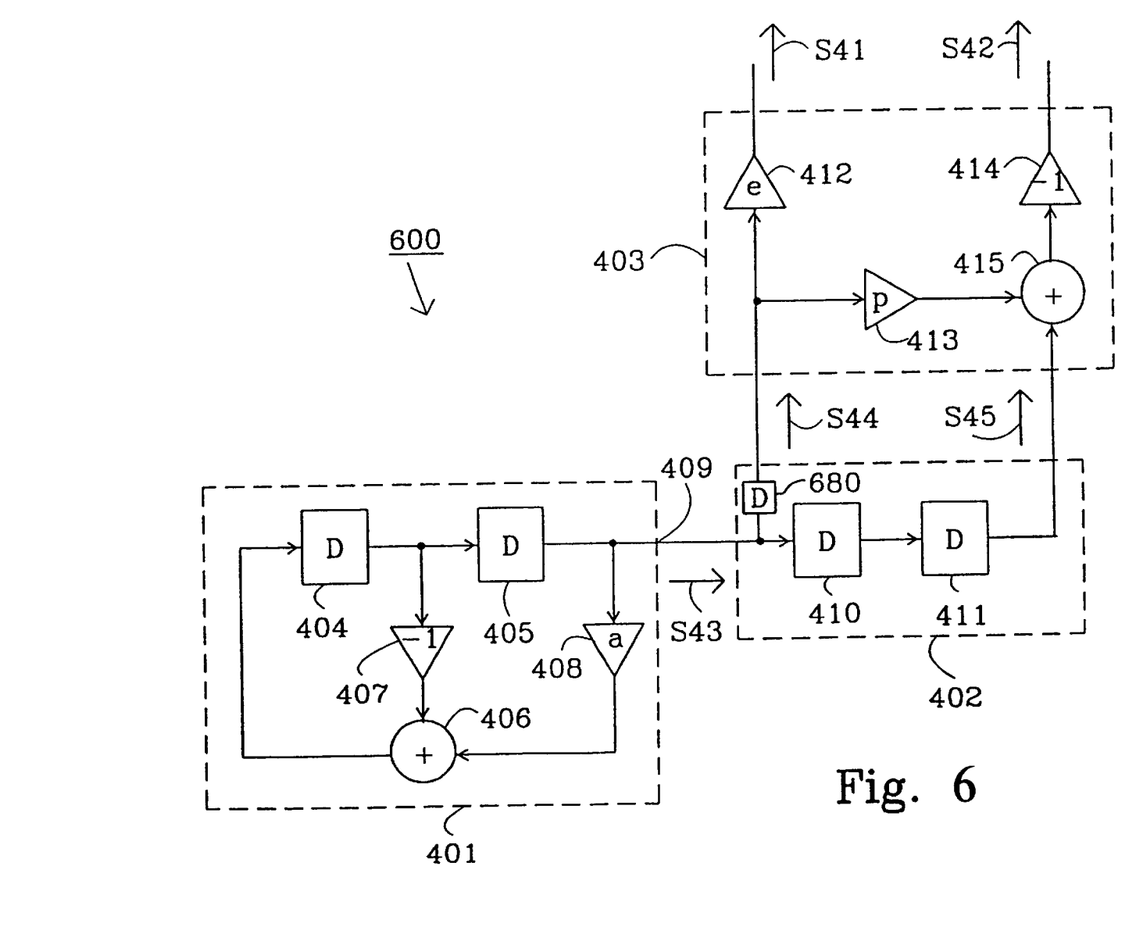
FIG. 6 is a block diagram illustrating another embodiment of the present invention.

The most straightforward way of implementing the phase shifting means is illustrated in FIG. 4 but alternative ways exist. One such alternative way is to generate the fourth digital sinusoidal signal S44 by delaying the third digital sinusoidal signal S43 a first number of sample steps and generating the fifth digital sinusoidal signal S45 by delaying the third digital sinusoidal signal S43 a second number of sample steps such that the first and the second number of sample steps differs. See FIG. 6. The important characteristics of the phase shifting means is that the fourth digital sinusoidal signal S44 and the fifth digital sinusoidal signal S45, derived from the third digital sinusoidal signal S43 and provided to the orthogonalization means, both have the same oscillation frequency, the same sampling frequency and a phase difference. The phase shifting means 402 being separate from the signal generating means 403 is an important feature of the invention. This enables the use of different types of digital single sinusoidal sources in an oscillator according to the invention. It also enables an increased control of the numerical properties of the oscillator since the coefficients used in the orthogonalization means 403, i.e. factor e and factor p, can be adjusted by selecting the number of sample steps N that the fifth digital sinusoidal signal S45 is delayed with respect to the fourth digital sinusoidal signal S44. In this way, the factors e and p can be adjusted in order to minimise an image spuriosis in the output from the digital oscillator 400 resulting from truncation errors in the representation of factors e and p used in the digital oscillator 400.

The orthogonalization means can be arranged to generate the first digital sinusoidal signal and the second digital sinusoidal signal in different ways as long as the linear combination of the fourth digital sinusoidal signal and the fifth digital sinusoidal signal formed by the orthogonalization means results in the first digital sinusoidal signal and the second digital sinusoidal signal both having the same predetermined oscillation frequency and the same sampling frequency and having a phase difference of $\pi/2$ radians between them. In a preferred embodiment, the amplitudes of both the first sinusoidal signal and the second sinusoidal signal are equal, but this is not a mandatory requirement.

In a preferred embodiment, the third digital sinusoidal signal generated by the generating means, as well as the fourth digital sinusoidal signal and the fifth digital sinusoidal signal derived by the phase shifting means, all have the same predetermined sampling frequency as the first and the second digital sinusoidal signals. However, it is possible to, for example, let the generating means generate a third digital sinusoidal signal having a sampling frequency higher than the predetermined sampling frequency and let the phase shifting means ignore some of the samples of the third digital sinusoidal signal when deriving the fourth and the fifth digital sinusoidal signals.

The various versions of the invention can be implemented in e.g. an ASIC or a DSP.

I claim:

1. A digital oscillator for generating a first digital sinusoidal signal and a second digital sinusoidal signal, both signals having in common a predetermined oscillation frequency and a predetermined sampling frequency and having a phase difference of $\pi/2$ radians between them, the oscillator comprising:

signal generating means for generating a third digital sinusoidal signal, wherein the signal generation means includes delay means;

phase shifting means connected to the signal generating means for receiving the third digital sinusoidal signal and deriving a fourth digital sinusoidal signal, and for deriving a fifth digital sinusoidal signal from the third digital sinusoidal signal, the derived signals having a phase difference between them;

orthogonalization means for producing the first digital sinusoidal signal and the second digital sinusoidal signals by forming predetermined linear combinations of the fourth digital sinusoidal signal and the fifth digital sinusoidal signal.

2. A digital oscillator according to claim 1 wherein said orthogonalization means produces said first digital sinusoidal signal and said second digital sinusoidal signal such that said signals have a predetermined amplitude in common.

3. A digital oscillator according to claim 1, wherein said signal generating means and said phase shifting means generate said third digital sinusoidal signal and derive said fourth digital sinusoidal signal and said fifth digital sinusoidal signal, respectively, such that all three signals have said predetermined oscillation frequency in common.

4. A digital oscillator according to claim 3, wherein said signal generating means and said phase shifting means generate said third digital sinusoidal signal and derive said fourth digital sinusoidal signal and said fifth digital sinusoidal signal, respectively, such that all three signals have said predetermined sampling frequency in common.

5. A digital oscillator according to claim 4, wherein said phase shifting means derives said fourth digital sinusoidal signal and said fifth digital sinusoidal signal such that said phase difference between them corresponds to a delay of the fifth digital sinusoidal signal with respect to the fourth digital sinusoidal signal of at least one sample step.

6. A digital oscillator according to claim 5 wherein said orthogonalization means comprises:
- a first multiplication means for producing said first digital sinusoidal signal by multiplying said fourth digital sinusoidal signal with a factor corresponding to sin $(\Omega_0 N)$;
- a second multiplication means for multiplying said fourth digital sinusoidal signal with a factor corresponding to $-\cos(\Omega_0 N)$;
- an adder for providing a sum by adding to said fifth digital sinusoidal signal the multiplied fourth digital sinusoidal signal; and
- a third multiplication means for producing said second digital sinusoidal signal by multiplying the sum provided by the adder with a factor $-1$, wherein $\Omega_0 = 2\pi f_0/f_s$ and $f_0$ is said predetermined oscillation frequency, $f_s$ is said predetermined sampling frequency and N is the number of sample steps with which said fifth digital sinusoidal signal is delayed with respect to said fourth digital sinusoidal signal.

7. A digital oscillator according to claim 1, wherein said signal generating means comprises a marginally stable second order filter loop.

8. A base station in a radio communication network, the base station comprising a radio receiver for receiving quadrature modulated radio signals, wherein the radio receiver comprises a digital oscillator according to claim 1.

9. A wireless terminal in a radio communication network, the wireless terminal comprising a radio receiver for receiving quadrature modulated radio signals, wherein the radio receiver comprises a digital oscillator according to claim 1.

10. A digital oscillator according to claim 1, wherein the phase shifting means derives the fourth digital sinusoidal signal by delaying the third digital sinusoidal signal a first number of sample steps, and the phase shifting means derives the fifth digital sinusoidal signal by delaying the third digital sinusoidal signal a second number of sample steps, such that the first and the second number of sample steps differs.

11. A digital oscillator according to claim 1, wherein the delay means comprises:
- a first delay means and a second delay means, wherein an output of the first delay means supplies a signal to an input of the second delay means.

12. A method for generating a first digital sinusoidal signal and a second digital sinusoidal signal, both signals having in common a predetermined oscillation frequency and a predetermined sampling frequency and having a phase difference of $\pi/2$ radians between them, the method comprising the steps of:
(a) generating, in signal generating means, a third digital sinusoidal signal, wherein the signal generating means includes a delay means;
(b) providing the third digital sinusoidal signal to phase shifting means;
(c) deriving a fourth digital sinusoidal signal and a fifth digital sinusoidal signal from the third digital sinusoidal signal, wherein the fourth digital sinusoidal signal and the fifth digital sinusoidal signal have a phase difference between them; and
(d) producing the first sinusoidal signal and the second sinusoidal signal by forming predetermined linear combinations of the fourth digital sinusoidal signal and the fifth digital sinusoidal signal.

13. A method according to claim 12, wherein said first digital sinusoidal signal and said second digital sinusoidal signal have a predetermined amplitude in common.

14. A method according to claim 12, wherein the third digital sinusoidal signal, the fourth digital sinusoidal signal and the fifth digital sinusoidal signal all have said predetermined oscillation frequency in common.

15. A method according to claim 14, wherein the third digital sinusoidal signal, the fourth digital sinusoidal signal and the fifth digital sinusoidal signal all have said predetermined sampling frequency in common.

16. A method according to claim 15, wherein said fourth digital sinusoidal signal and said fifth digital sinusoidal signal are derived in said deriving step (c) such that said phase difference corresponds to a delay of said fifth digital sinusoidal signal with respect to said fourth digital sinusoidal signal with at least one sample step.

17. A method according to claim 16 wherein said deriving step (c) includes deriving said fifth digital sinusoidal signal by delaying said third digital sinusoidal signal said at least one sample step and also providing said third digital sinusoidal signal as said fourth digital sinusoidal signal.

18. A method according to claim 16, wherein said producing step (d) includes producing said first digital sinusoidal signal by multiplying said fourth digital sinusoidal signal with a factor corresponding to $\sin(\Omega_0 N)$, producing said second digital sinusoidal signal by forming a sum by adding to said fifth digital sinusoidal signal said fourth digital sinusoidal signal multiplied with a factor corresponding to $-\cos(\Omega_0 N)$ and multiplying the sum with a factor $-1$, wherein $\Omega_0 = 2\pi f_0/f_s$ and $f_0$ is said predetermined oscillation frequency, $f_s$ said predetermined sampling frequency and N is the number of sample steps with which said fifth digital sinusoidal signal is delayed with respect to said fourth digital sinusoidal signal.

19. A method according to claim 12 wherein said generating step (a) includes generating said third digital sinusoidal signal in a marginally stable second order filter loop.

20. A method according to claim 12 said generating step (a) comprises the steps of:
(e) storing in storage means a precalculated sequence of values specifying a sinusoidal signal;
(f) generating said third digital sinusoidal signal by reading values from the storage means.

21. A method according to claim 12, wherein the fourth digital sinusoidal signal is derived by delaying the third digital sinusoidal signal a first number of sample steps, and the fifth digital sinusoidal signal is derived by delaying the third digital sinusoidal signal a second number of sample steps, such that the first and the second number of sample steps differs.

22. An apparatus for generating a first sinusoidal signal and a second sinusoidal signal, wherein the first and second sinusoidal signals have a predetermined oscillation frequency and a predetermined sampling frequency, and wherein there is a predetermined phase difference between the first and second sinusoidal signals, the oscillator comprising:
- signal generating means for generating a third sinusoidal signal, wherein the signal generating means includes a delay means;
- phase shifting means for receiving the third sinusoidal signal and deriving a fourth sinusoidal signal from the third sinusoidal signal, the fourth sinusoidal signal and the third sinusoidal signal having a phase difference between them;

orthogonalization means for producing the first sinusoidal signal and the second sinusoidal signals by forming predetermined linear combinations of the third sinusoidal signal and the fourth sinusoidal signal.

23. The apparatus of claim 22, wherein the first, second, third and fourth sinusoidal signals are digital sinusoidal signals.

24. A digital oscillator for generating a first digital sinusoidal signal and a second digital sinusoidal signal, both signals having in common a predetermined oscillation frequency and a predetermined sampling frequency and having a phase difference of $\pi/2$ radians between them, the oscillator comprising:

signal generating means for generating a third digital sinusoidal signal, wherein the signal generating means includes storage means in which a precalculated sequence of values specifying a sinusoidal signal is stored such that the signal generating means generates said third digital sinusoidal signal by reading values from the storage means;

phase shifting means, which is electrically connected to the signal generating means for receiving the third digital sinusoidal signal and deriving a fourth digital sinusoidal signal, and for deriving a fifth digital sinusoidal signal from the third digital sinusoidal signal, the derived signals having a phase difference between them;

orthogonalization means for producing the first digital sinusoidal signal and the second digital sinusoidal signals by forming predetermined linear combinations of the fourth digital sinusoidal signal and the fifth digital sinusoidal signal.

* * * * *